(12) United States Patent
Zhang et al.

(10) Patent No.: US 10,498,063 B2
(45) Date of Patent: Dec. 3, 2019

(54) CLAMP JAW FOR BY-PASS TYPE METER SOCKETS

(71) Applicant: Siemens Industry, Inc., Alpharetta, GA (US)

(72) Inventors: Fan Zhang, Suwanee, GA (US); Brian J. Rusch, Suwanee, GA (US); Carey D. Harnois, Grayson, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 32 days.

(21) Appl. No.: 15/689,190

(22) Filed: Aug. 29, 2017

(65) Prior Publication Data

US 2019/0064213 A1    Feb. 28, 2019

(51) Int. Cl.
| | | |
|---|---|---|
| *G01R 1/04* | (2006.01) | |
| *G01R 11/04* | (2006.01) | |
| *H01R 13/11* | (2006.01) | |
| *H01R 13/187* | (2006.01) | |

(52) U.S. Cl.
CPC ......... *H01R 13/187* (2013.01); *G01R 1/0416* (2013.01); *G01R 11/04* (2013.01); *H01R 13/11* (2013.01)

(58) Field of Classification Search
CPC ...... G01R 11/04; G01R 11/24; G01R 1/0416; G01R 1/22; G01R 22/00; G01R 22/063; G01R 22/065; H01H 1/365; H01H 1/42; H01H 9/34; H01H 1/2041; H01H 21/54; H01H 9/10; H01H 9/104; H01R 2103/00; H01R 24/76; H01R 9/24; H01R 13/11; H01R 25/006; H01R 25/168; H01R 33/945

USPC ....... 439/517, 858, 508, 822, 638, 146, 370, 439/372, 839; 361/668, 664, 660, 662, 361/670, 624, 637, 665

See application file for complete search history.

(56) References Cited

U.S. PATENT DOCUMENTS

| | | | | |
|---|---|---|---|---|
| 2,907,856 | A * | 10/1959 | Ballou | H01H 1/42 200/256 |
| 3,003,085 | A * | 10/1961 | Rund | G01R 11/04 24/498 |
| 5,762,522 | A * | 6/1998 | Robinson | G01R 11/04 439/146 |
| 5,775,942 | A * | 7/1998 | Jeffcoat | G01R 1/0416 361/668 |

(Continued)

*Primary Examiner* — James Harvey
*Assistant Examiner* — Matthew T Dzierzynski

(57) ABSTRACT

A meter socket is provided for watt-hour meters. The meter socket comprises a block assembly mounted at a center of the meter socket, a bypass mechanism situated in the bottom portion of the block assembly and a plurality of clamp jaws. The block assembly includes a top portion and a bottom portion. The bypass mechanism includes a plurality of rotary bypass blades coupled to a lever arm. Each clamp jaw includes a clamp jaw assembly that includes a jigsaw mechanism situated in the top portion of the block assembly. The jigsaw mechanism includes a copper jaw bus, a contact plate, a jaw spring, a bypass spring, a compression spring, a shoulder screw, a rivet or one or more fasteners. Each clamp jaw further includes a clamp jaw bypass mechanism that includes a jaw opening formed between the copper jaw bus and the jaw spring to receive a rotary bypass blade of the plurality of rotary bypass blades of the bypass mechanism.

20 Claims, 11 Drawing Sheets

(56) References Cited

U.S. PATENT DOCUMENTS

| | | | | |
|---|---|---|---|---|
| 5,834,932 A * | 11/1998 | May | ................ | G01R 11/04 |
| | | | | 324/107 |
| 5,945,650 A * | 8/1999 | Holland | ................ | H01H 9/104 |
| | | | | 200/15 |
| 6,409,537 B2 * | 6/2002 | Robinson | ................ | G01R 11/04 |
| | | | | 439/517 |
| 6,793,542 B1 * | 9/2004 | White | ................ | G01R 11/04 |
| | | | | 439/822 |
| 6,921,290 B1 | 7/2005 | Kellerman | | |
| 6,945,813 B1 * | 9/2005 | Kellerman | ................ | H01R 13/193 |
| | | | | 439/508 |
| 7,018,247 B1 | 3/2006 | Ranta et al. | | |
| 7,040,921 B2 | 5/2006 | Kellerman | | |
| 7,297,021 B1 * | 11/2007 | Dixon | ................ | H01H 1/365 |
| | | | | 200/244 |
| 7,347,722 B2 * | 3/2008 | Zhang | ................ | G01R 11/04 |
| | | | | 439/517 |
| 7,400,495 B1 * | 7/2008 | Ranta | ................ | G01R 11/24 |
| | | | | 361/660 |
| 8,182,282 B2 * | 5/2012 | Baca | ................ | G01R 11/04 |
| | | | | 361/662 |

\* cited by examiner

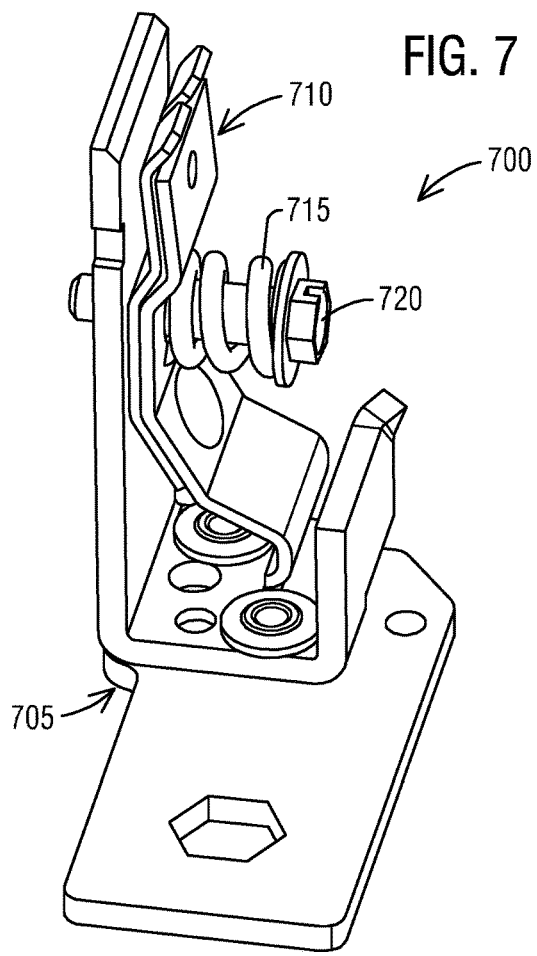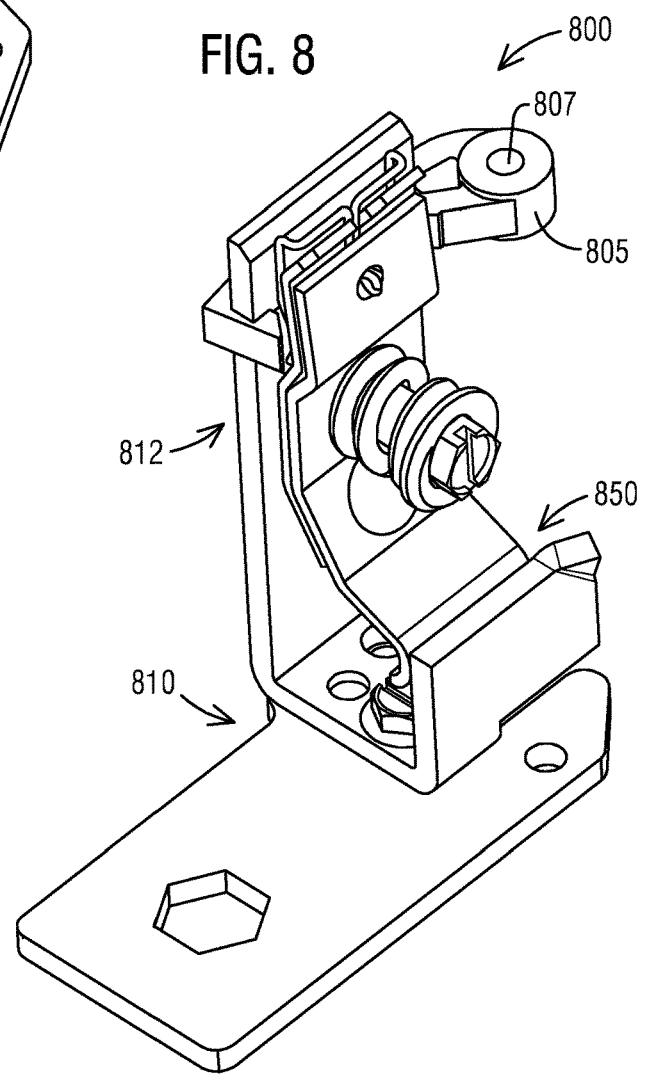

View A-A

FIG. 15

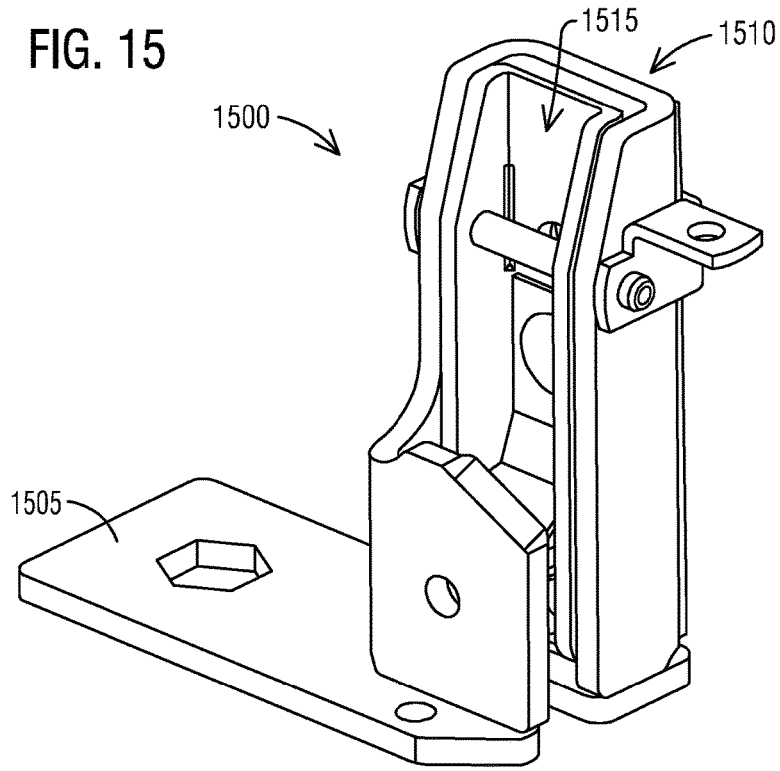

FIG. 16

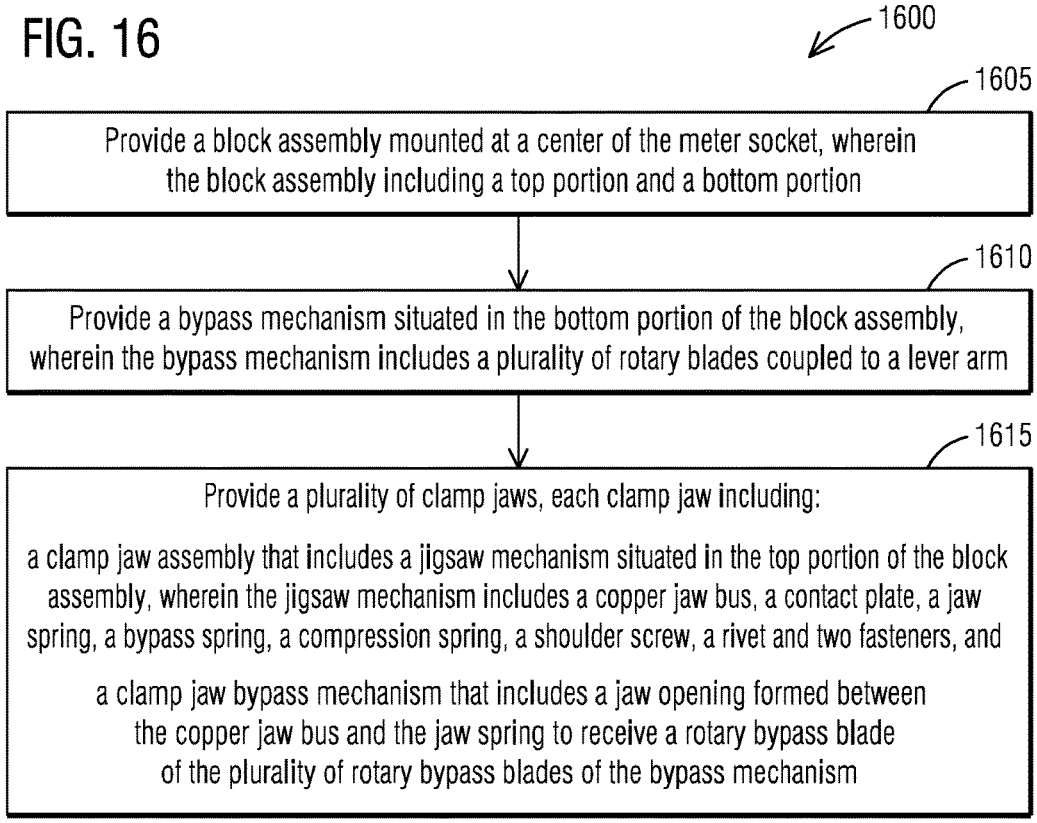

- 1605: Provide a block assembly mounted at a center of the meter socket, wherein the block assembly including a top portion and a bottom portion

- 1610: Provide a bypass mechanism situated in the bottom portion of the block assembly, wherein the bypass mechanism includes a plurality of rotary blades coupled to a lever arm

- 1615: Provide a plurality of clamp jaws, each clamp jaw including:

a clamp jaw assembly that includes a jigsaw mechanism situated in the top portion of the block assembly, wherein the jigsaw mechanism includes a copper jaw bus, a contact plate, a jaw spring, a bypass spring, a compression spring, a shoulder screw, a rivet and two fasteners, and a clamp jaw bypass mechanism that includes a jaw opening formed between the copper jaw bus and the jaw spring to receive a rotary bypass blade of the plurality of rotary bypass blades of the bypass mechanism

CLAMP JAW FOR BY-PASS TYPE METER SOCKETS

BACKGROUND

1. Field

Aspects of the present invention generally relate to a clamp jaw as a meter jaw for a by-pass type meter socket and more specifically relate to a meter socket based on a plurality of clamp jaws for watt-hour meters.

2. Description of the Related Art

A meter socket is a type of outdoors electrical socket that connects a watt-hour meter, or electrical meter, to a house. These are the meters outside houses, commercial buildings and construction sites that measure the amount of power used so the supplier knows what to charge. A meter socket must be weatherproof, so it can stand up to rain, wind, snow and other elements of nature. The main difference between various meter sockets is the amount of amps they can safely read; they generally range from 100 amps to 320 amps.

A meter socket is considerably larger than a common outlet socket found inside houses and other structures. The input also is different from the common two- or three-hole inputs found on outlets. This is because meters use different wires, and the input is able to handle more power at once than the smaller outlets.

Meter sockets house the utilities electrical watt-hour meters in residential and commercial buildings. Sockets work with a circuit breaker distribution section in a rain-proof enclosure for residential installations, rural service entrance, mobile homes, and for temporary power on construction sites.

Watt-hour meters are typically used by electric utilities to measure electrical consumption in residential, commercial and industrial applications. To accommodate the watt-hour meter, equipment is provided with a watt-hour meter socket. Such a meter socket contains a plurality of "meter jaws" to accept bayonet stabs or contacts on the base of the watt-hour meter. Meter sockets have locking jaws for receiving the bayonet or blade contacts of a watt-hour meter. Meter jaws are used for a meter socket assembly. These meter jaws can be used with meter blocks of various sizes, configurations, and power levels.

A meter socket can be of a by-pass type and use a clamp jaw as a meter jaw. However, the current clamp jaw lever bypass meter sockets rated 100A to 320A continuous duty are very complicated to assemble as they comprise more than 100 parts requiring more than 15 special too lings and fixtures in its manufacturing process. The jaw housing has very complicated profile that requires special copper alloy to be fabricated properly and the hard tool for the jaw housing also requires frequent maintenance. Additionally, the jaw housings need to be solder welded together in a very expensive process.

Therefore, there is a need for effectively manufacturing clamp jaw lever bypass meter sockets while overcoming various problems and shortcomings of the prior art.

SUMMARY

Briefly described, aspects of the present invention relate to a clamp jaw lever bypass mechanism including a jigsaw mechanism for the clamp jaw in a top portion and a bypass mechanism at a bottom portion of meter jaws. The clamp jaw assembly comprises a copper jaw bus, a contact plate, a jaw spring, a bypass spring, a compression spring, a shoulder screw, a rivet and two fasteners. The copper jaw bus and the contact plate are assembled to a jaw assembly with two fasteners, which can be either screws or rivets. The jaw spring and bypass spring are attached together with a rivet to form a spring combo. Then the jaw assembly and the spring combo are assembled with a compression spring and a shoulder screw (or a screw with a tube). Typically, a single phase lever bypass meter socket has four clamp jaw assemblies, while a three phase lever bypass meter socket has six clamp jaw assemblies. The jaw openings in the clamp jaw assemblies formed between the copper jaw bus and the jaw spring are to accept watt-hour meter blades. The gaps in the lower portion of the clamp jaw assemblies are designated to engage bypass blades.

In accordance with one illustrative embodiment of the present invention, a meter socket is provided for watt-hour meters. The meter socket comprises a block assembly mounted at a center of the meter socket, a bypass mechanism situated in the bottom portion of the block assembly and a plurality of clamp jaws. The block assembly includes a top portion and a bottom portion. The bypass mechanism includes a plurality of rotary bypass blades coupled to a lever arm. Each clamp jaw includes a clamp jaw assembly that includes a jigsaw mechanism situated in the top portion of the block assembly. The jigsaw mechanism includes a copper jaw bus, a contact plate, a jaw spring, a bypass spring, a compression spring, a shoulder screw, a rivet or one or more fasteners. Each clamp jaw further includes a clamp jaw bypass mechanism that includes a jaw opening formed between the copper jaw bus and the jaw spring to receive a rotary bypass blade of the plurality of rotary bypass blades of the bypass mechanism.

In accordance with another illustrative embodiment of the present invention, a meter jaw comprises a connector assembly, a jaw spring combo, a compression spring and a shoulder screw or a screw and a cylinder spacer.

In accordance with yet another illustrative embodiment of the present invention, a method is provided for providing a meter socket for watt-hour meters. The method comprises providing a block assembly mounted at a center of the meter socket, providing a bypass mechanism situated in the bottom portion of the block assembly, and providing a plurality of clamp jaws. The block assembly including a top portion and a bottom portion. The bypass mechanism includes a plurality of rotary bypass blades coupled to a lever arm. Each clamp jaw includes a clamp jaw assembly that includes a jigsaw mechanism situated in the top portion of the block assembly, wherein the jigsaw mechanism includes a copper jaw bus, a contact plate, a jaw spring, a bypass spring, a compression spring, a shoulder screw, a rivet and two fasteners. Each clamp jaw further includes a clamp jaw bypass mechanism that includes a jaw opening formed between the copper jaw bus and the jaw spring to receive a rotary bypass blade of the plurality of rotary bypass blades of the bypass mechanism.

Still other aspects, features, and advantages of the present invention may be readily apparent from the following description by illustrating a number of example embodiments and implementations. The present invention may also be capable of other and different embodiments, and its details may be modified in various respects, all without departing from the substance and scope of the present invention. The invention covers all modifications, equivalents, and alternatives falling within the substance and scope of the invention.

BRIEF DESCRIPTION OF THE DRAWINGS

FIG. 7 shows a meter jaw in accordance with an exemplary embodiment of the present invention.

FIG. 8 shows another meter jaw in accordance with another embodiment of the present invention.

FIG. 15 shows a perspective view of a meter jaw of prior art.

FIG. 16 illustrates a flowchart of a method for providing a meter socket for watt-hour meters according to an exemplary embodiment of the present invention.

DETAILED DESCRIPTION

Figure 1:
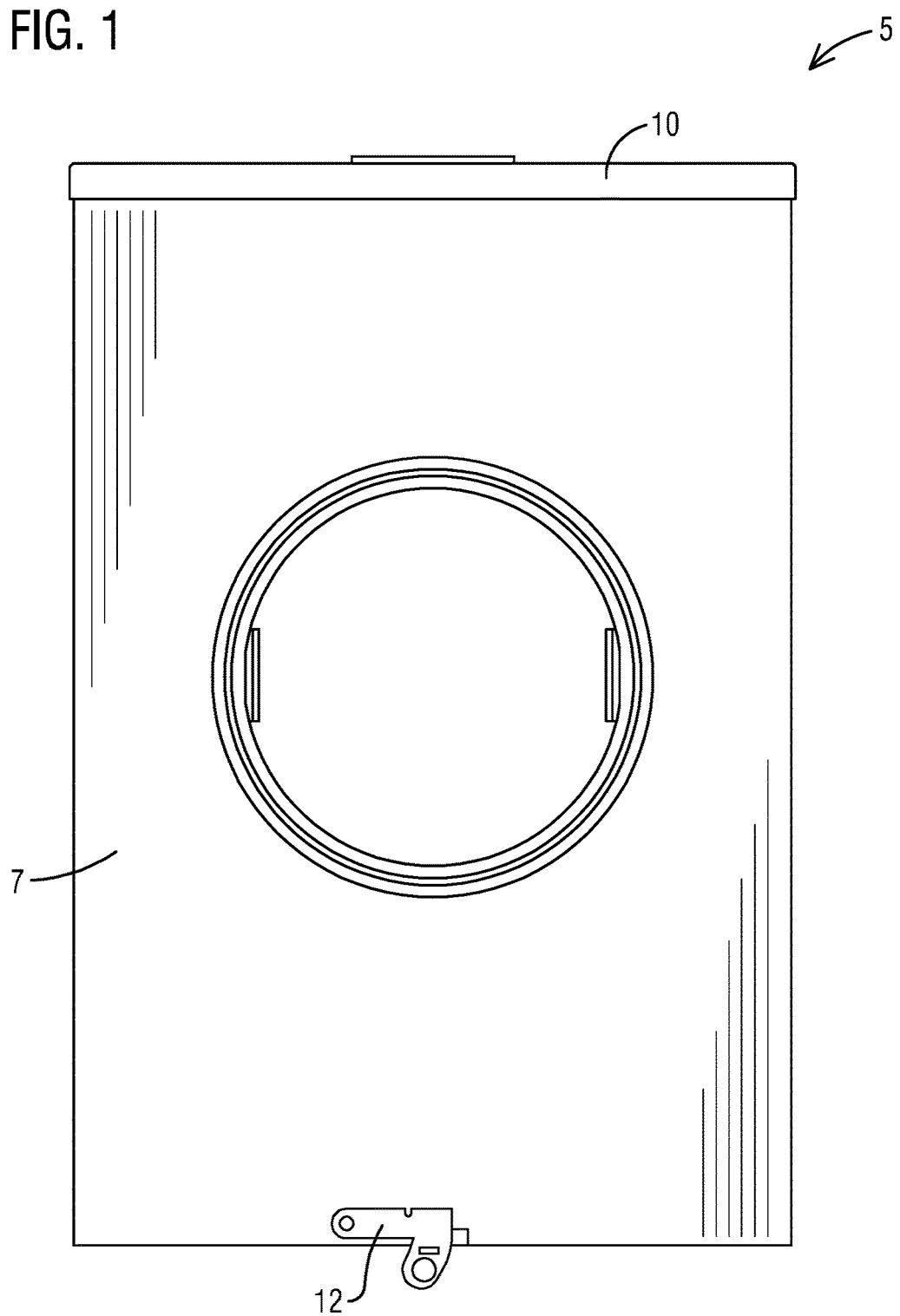
FIG. 1 illustrates a front view of a meter socket for watt-hour meters in accordance with an exemplary embodiment of the present invention.

To facilitate an understanding of embodiments, principles, and features of the present invention, they are explained hereinafter with reference to implementation in illustrative embodiments. In particular, they are described in the context of a by-pass type meter socket for watt-hour meters that uses a clamp jaw with a jigsaw mechanism and a bypass mechanism. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of a bypass-type meter socket for watt-hour meters that uses a clamp jaw as a meter jaw are described below with reference to FIGS. 1-16. The drawings are not necessarily drawn to scale. Like reference numerals are used throughout to denote like elements.

Consistent with one embodiment of the present invention, FIG. 1 represents a front view of a meter socket 5 for watt-hour meters in accordance with an exemplary embodiment of the present invention. The meter socket 5 comprises a meter cover 7 and an enclosure 10. The meter cover 7 with a round opening for a watt-hour meter is secured to the enclosure 10 with a rotary latch 12. The meter socket 5 may be a single phase lever bypass meter socket having four clamp jaw assemblies. Alternatively, the meter socket 5 may be a three phase lever bypass meter socket having six clamp jaw assemblies.

Socket type electrical watt-hour meters are used to measure and indicate the amount of electrical power consumption in a residence, industry or business. Typically, a socket type watt-hour meter plugs into the meter socket 5 using a blade-like stab or meter blade connector located on the watt-hour meter. The meter socket 5 itself is mounted inside a meter base or a panel. The meter socket 5 commonly has a spring loaded receptacle-like jaw to receive and contact the watt-hour meter blade insertion. The meter jaw and spring provide enough force to press meter blade and conduct electricity while maintaining a certain current load and a heat rise. The line side of the meter socket 5 is connected to the utility electrical power source, while the load side of the meter socket 5 is connected to the tenant. A watt-hour meter is inserted onto the meter jaws on the meter socket 5 to bridge the line and load making the electrical connection between the utility power source and the tenant. In the industry, spring tempered copper meter jaws are mounted on meter sockets to receive plug-in watt-hour meters.

Figure 2:
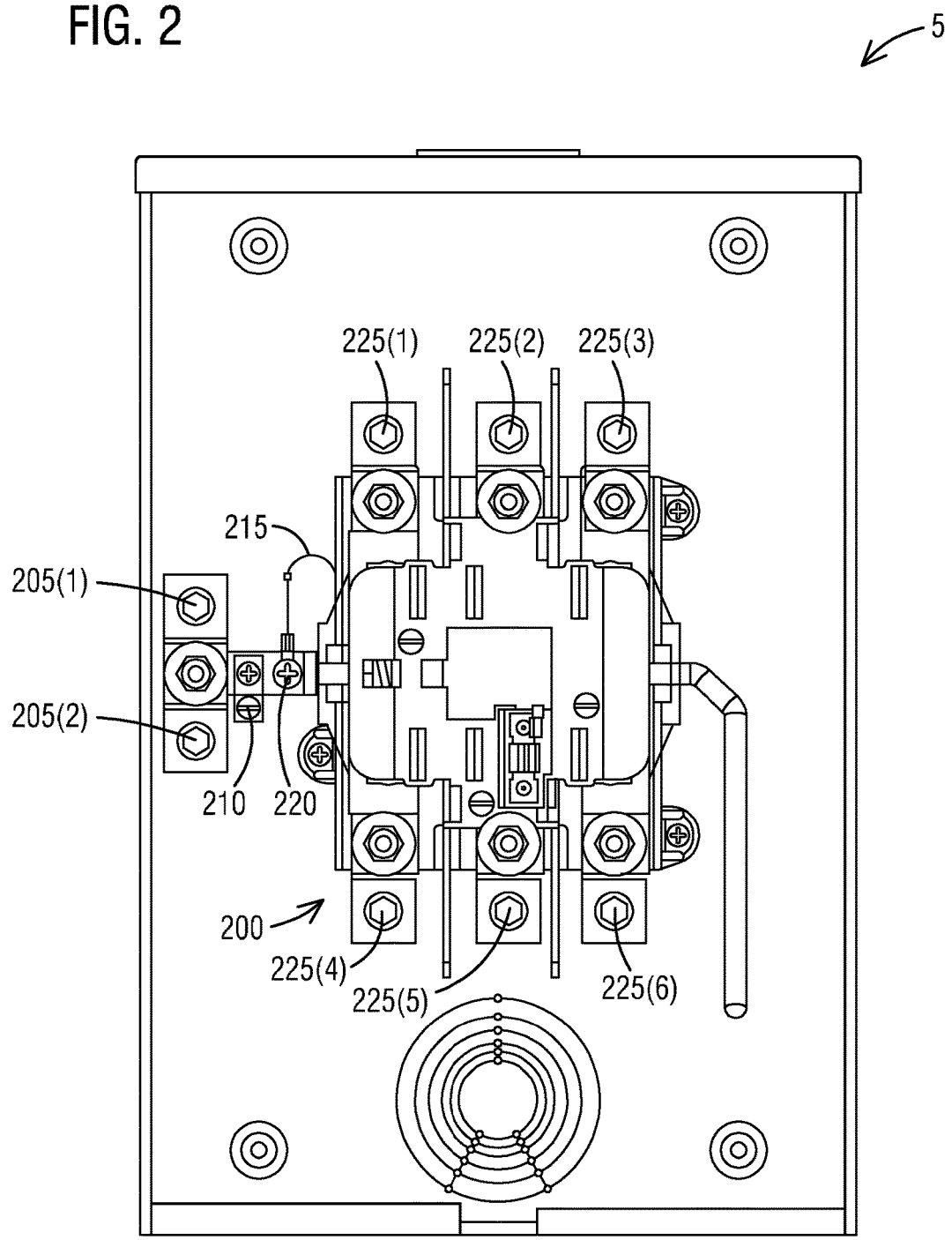
FIG. 2 illustrates interiors of the meter socket of FIG. 1 in accordance with an exemplary embodiment of the present invention.

Referring to FIG. 2, it illustrates interiors of the meter socket 5 of FIG. 1 in accordance with an exemplary embodiment of the present invention. A 3 phase lever bypass meter socket block assembly 200 is mounted at center of the meter socket 5. A plurality of neutral lugs 205(1-2) and ground lugs 210 are mounted on the left side of the meter socket 5. A potential lead 215 connects the $7^{th}$ jaw of a 3 phase watt-hour meter to a neutral 220. A plurality of mechanical lugs 225(1-6) are mounted on a line terminal and a load terminal of the 3 phase lever bypass meter socket block assembly 200.

Figure 3:
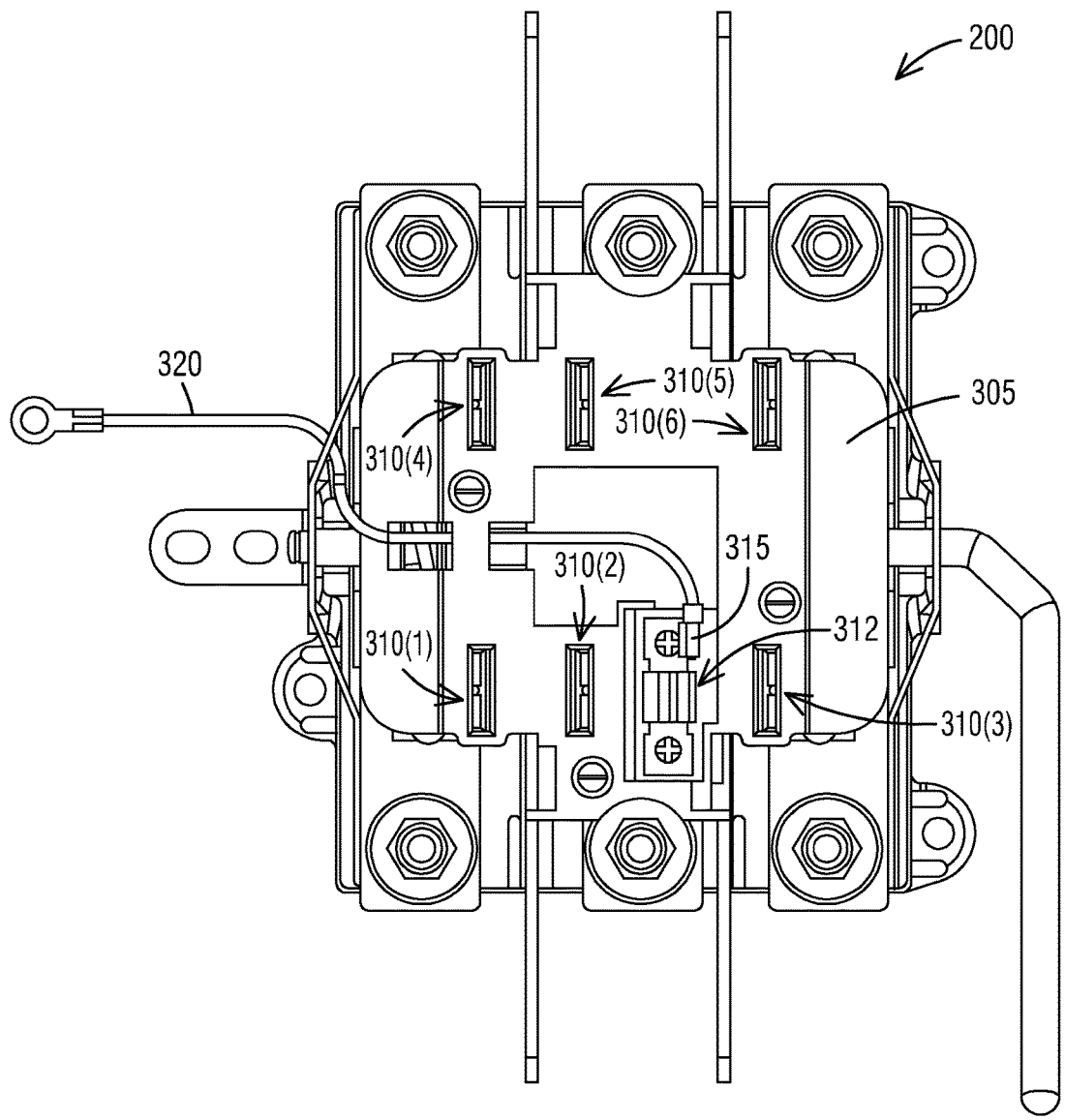
FIG. 3 illustrates a front view of a 3 phase lever bypass meter socket block assembly in accordance with an exemplary embodiment of the present invention.

Turning now to FIG. 3, it illustrates a front view of the 3 phase lever bypass meter socket block assembly 200 in accordance with an exemplary embodiment of the present invention. The 3 phase lever bypass meter socket block assembly 200 has a plastic shield 305 on top of a plurality of meter jaws 310(1-6) such as clamp jaws. The plastic shield 305 has 3 pairs of rectangular slots to let through the watt-hour meter blades to plug into the meter jaws 310(1-6) under the plastic shield 305. A $7^{th}$ jaw 312 located on a 6 o'clock position of the plastic shield 305 has a tang 315 to connect to a potential lead 320. The plastic shield 305 has barriers to separate the phase connectors.

Figure 4:
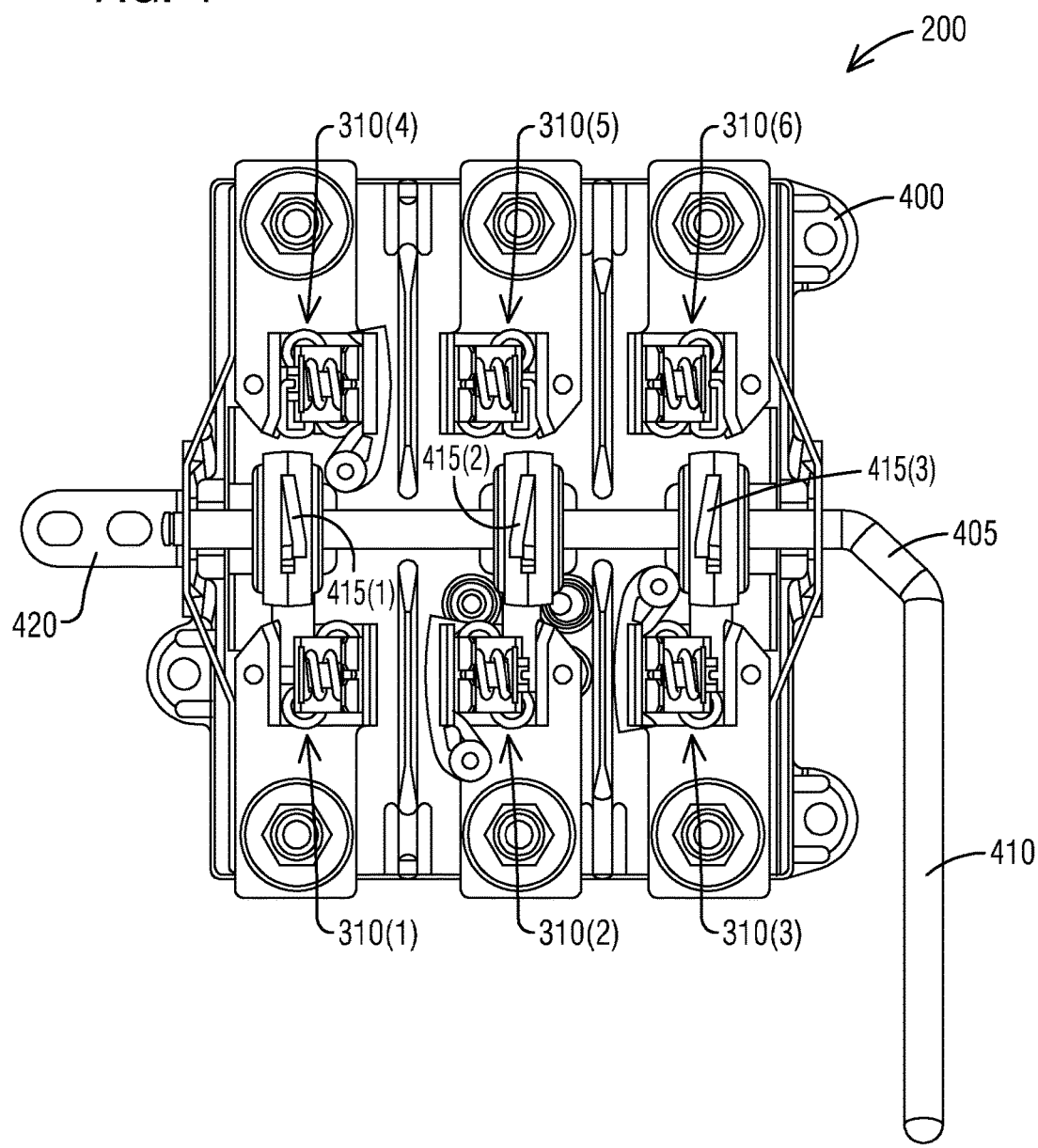
FIG. 4 shows the meter jaws under the plastic shield in accordance with an exemplary embodiment of the present invention.

FIG. 4 shows the meter jaws 310(1-6) under the plastic shield 305 in accordance with an exemplary embodiment of the present invention. The meter jaws 310(1-6) are in 3 pairs vertically mounted on a thermalset plastic block 400. Each pair of meter jaws 310(1-6), for connecting each phase of 3 phase electrical system, are to accept a pair of blades under a 3 phase watt-hour meter. A lever arm 405 goes through the horizontal centerline of the 3 phase lever bypass meter socket block assembly 200, and a handle 410 of the lever arm 405 is extended downward on the right side of the thermalset plastic block 400. The meter socket 5 comprises 3 rotary bypass blades 415(1-3) that are installed on the lever arm 405 to engage with the 3 pairs of meter jaws 310(1-6) for activating the meter jaws 310(1-6), bypassing the meter jaws 310(1-6) and disengaging the meter jaws 310(1-6) and releasing the meter jaws 310(1-6).

The meter socket 5 further comprises a meter socket supporting bracket 420 that is a steel bracket on both sides of the thermalset plastic block 400. The lever arm 405 is installed through the meter socket supporting bracket 420.

Figure 5:
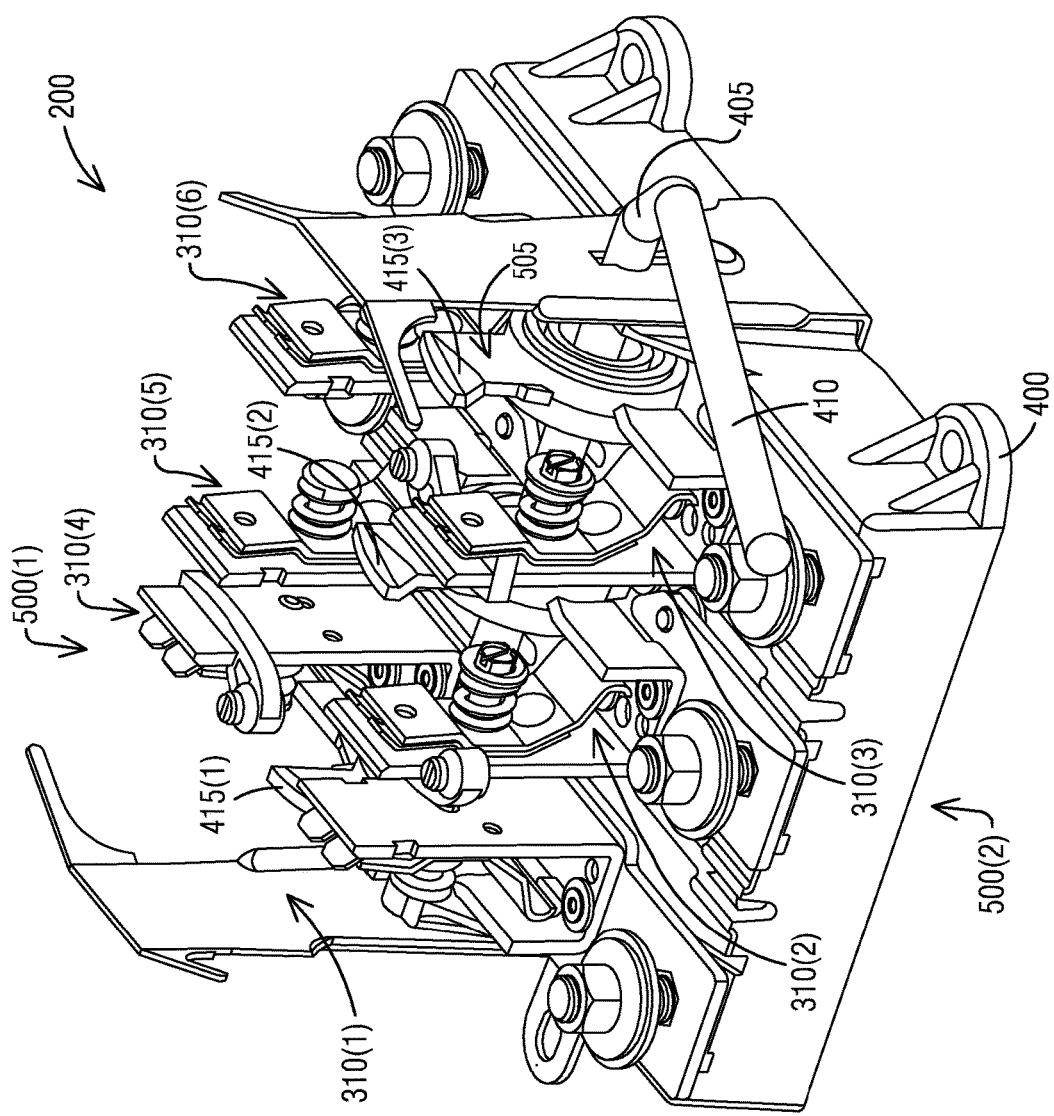
FIG. 5 shows the 3 phase lever bypass meter socket block assembly when the lever arm is at a resting position in accordance with an exemplary embodiment of the present invention.

As seen in FIG. 5, it shows the 3 phase lever bypass meter socket block assembly 200 when the lever arm 405 is at a resting position in accordance with an exemplary embodiment of the present invention. The 3 phase lever bypass meter socket block assembly 200 includes a top portion 500(1) and a bottom portion 500(2). The meter socket 5 comprises a bypass mechanism 505 situated in the bottom portion 500(2) of the 3 phase lever bypass meter socket block assembly 200, wherein the bypass mechanism 505 includes the plurality of rotary bypass blades 415(1-3) coupled to the lever arm 405. The meter socket 5 further comprises a plurality of clamp jaws such as the meter jaws 310(1-6). For example, the plurality of clamp jaws is meter jaws that are vertically mounted on the thermalset plastic block 400.

Figure 6:
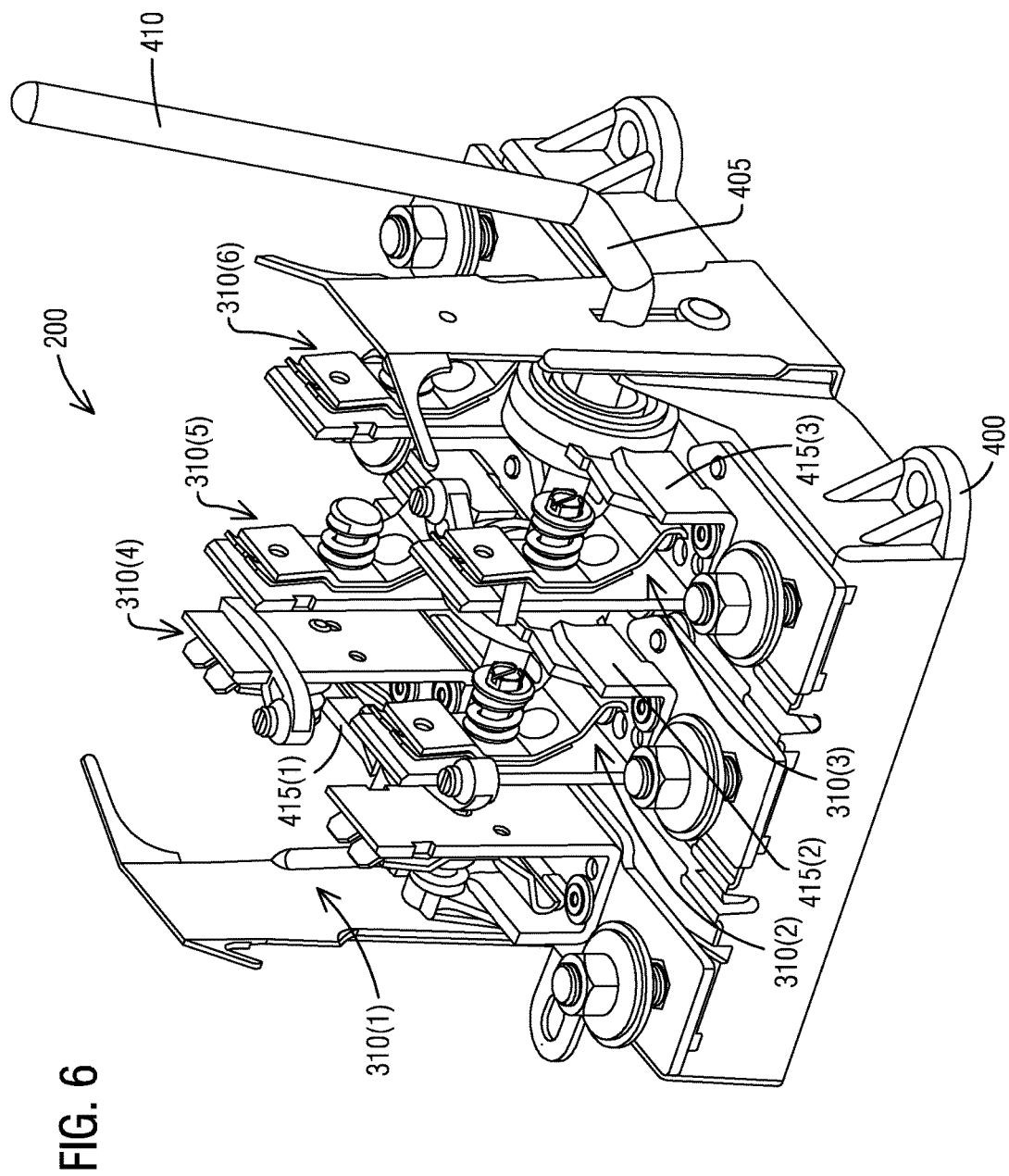
FIG. 6 shows the 3 phase lever bypass meter socket block assembly when the lever arm is engaged in the upper position in accordance with an exemplary embodiment of the present invention.

As shown in FIG. 6, it shows the 3 phase lever bypass meter socket block assembly 200 when the lever arm 405 is engaged in an upper position in accordance with an exemplary embodiment of the present invention. When the lever arm 405 is engaged in the upper position the plurality of rotary bypass blades 415(1-3) insert into a gap between a lower tab of a clamp jaw of the plurality of clamp jaws such as the meter jaws 310(1-6) such that one side of a rotary bypass blade of the plurality of rotary bypass blades 415(1-3) makes contact to the lower tab of the clamp jaw of the plurality of clamp jaws such as the meter jaws 310(1-6), while another side of the rotary bypass blade of the plurality of rotary bypass blades 415(1-3) pushes a lower portion of the jaw spring and drives the clamp jaw of the plurality of clamp jaws such as the meter jaws 310(1-6) open at a top.

In FIG. 7, it shows a first meter jaw 700 in accordance with an exemplary embodiment of the present invention. The meter jaw 700 comprises a connector assembly 705, a jaw spring combo 710, a compression spring 715 and a shoulder screw 720 or a screw and a cylinder spacer. The connector assembly 705 is assembled together by either two screws or two rivets. The connector assembly 705 is a fastened together flat bus and a "J" shaped jaw housing.

FIG. 8 shows a second meter jaw 800 in accordance with another embodiment of the present invention. The second meter jaw 800 comprises a plastic clip 805 that hooks on a back of the meter jaw 800. The plastic clip 805 has a hole 807 at an end for mounting the plastic shield 305. The second meter jaw 800 is a clamp jaw that includes a clamp jaw assembly 810 that includes a jigsaw mechanism 812 situated in the top portion 500(1) of the 3 phase lever bypass meter socket block assembly 200. The second meter jaw 800 further includes a clamp jaw bypass mechanism 850 that includes a jaw opening to receive a rotary bypass blade of the plurality of rotary bypass blades 415(1-3) of the bypass mechanism 505.

Figure 9:
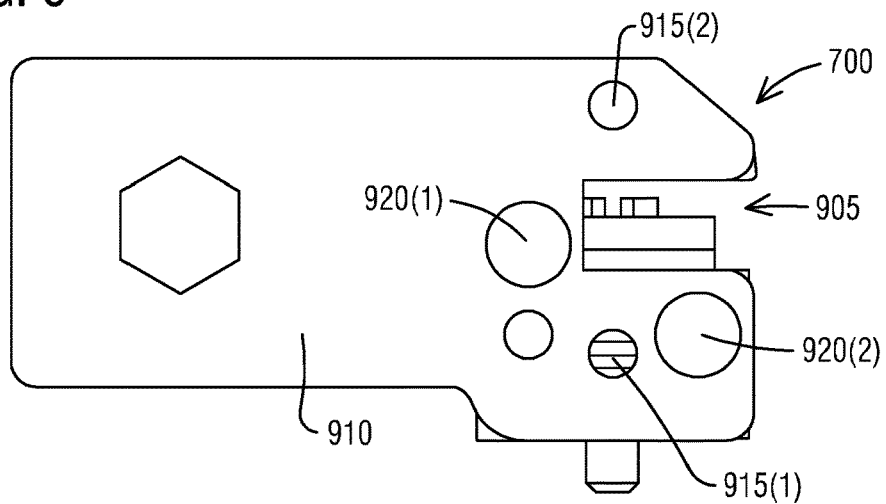
FIG. 9 shows a bottom view of the meter jaw of FIG. 7 in accordance with an exemplary embodiment of the present invention.
Figure 10:
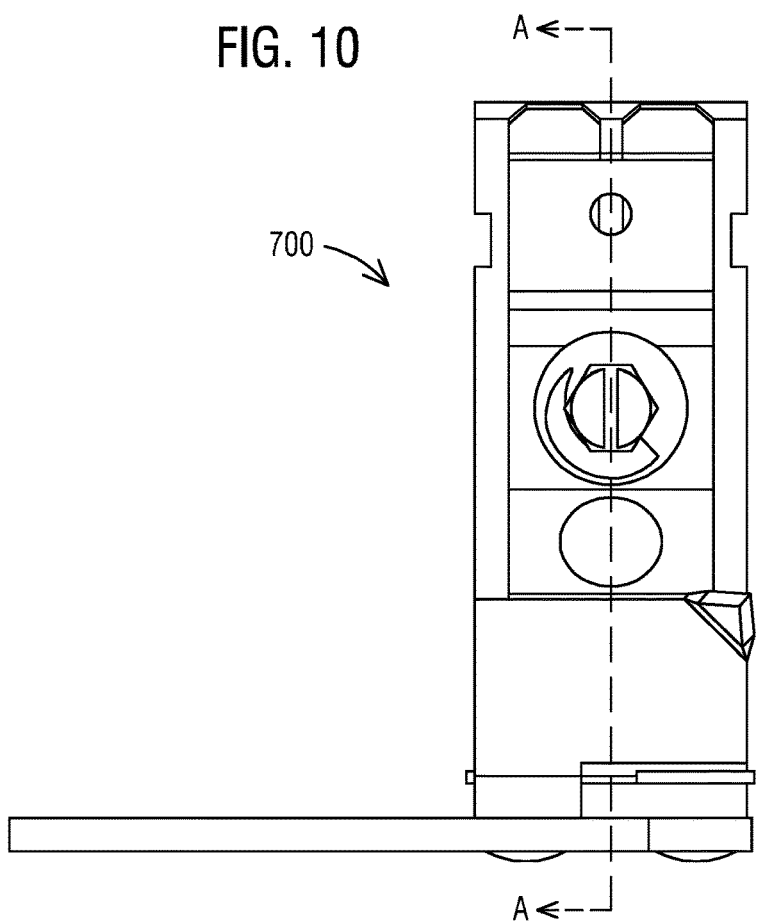
FIG. 10 shows a front view of the meter jaw of FIG. 7 in accordance with an exemplary embodiment of the present invention.
Figure 11:
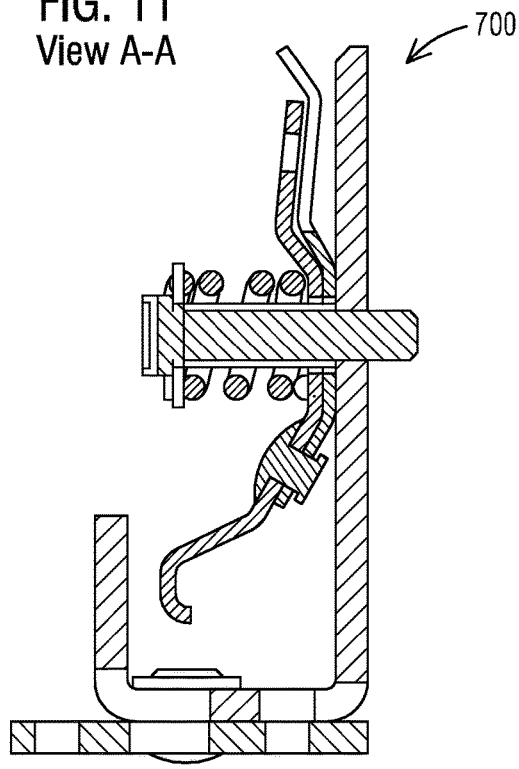
FIG. 11 shows a cross-sectional view of the meter jaw of FIG. 7 at line A-A in accordance with an exemplary embodiment of the present invention.
Figure 12:
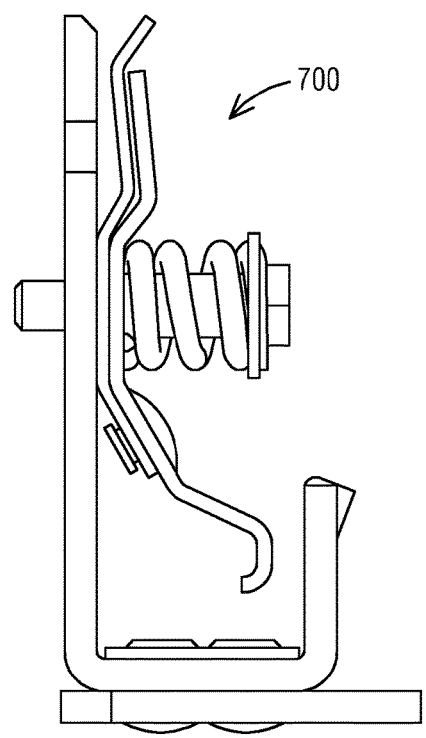
FIG. 12 shows a left side view of the meter jaw of FIG. 7 in accordance with an exemplary embodiment of the present invention.
Figure 13:
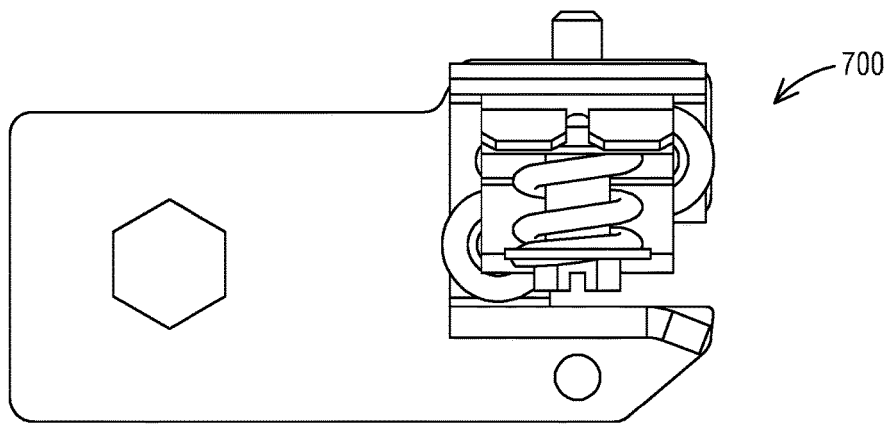
FIG. 13 shows a top view of the meter jaw of FIG. 7 in accordance with an exemplary embodiment of the present invention.

FIG. 9 shows a bottom view of the first meter jaw 700 of FIG. 7 in accordance with an exemplary embodiment of the present invention. FIG. 10 shows a front view of the first meter jaw 700 of FIG. 7 in accordance with an exemplary embodiment of the present invention. FIG. 11 shows a cross-sectional view of the first meter jaw 700 of FIG. 7 at line A-A in accordance with an exemplary embodiment of the present invention. FIG. 12 shows a left side view of the first meter jaw 700 of FIG. 7 in accordance with an exemplary embodiment of the present invention. FIG. 13 shows a top view of the first meter jaw 700 of FIG. 7 in accordance with an exemplary embodiment of the present invention.

Referring to FIGS. 9-13, the front view is at center, surrounded by top view, bottom view, left view and right view that is a cross-sectional view. The first meter jaw 700 is built on the connector assembly 705 that is a fastened together a flat bus and a "J" shaped jaw housing. There is a rectangular slot 905 on the right end of a flat connector 910 for a bypass blade passing through (bottom view). The left end of the flat bus has features for terminal connections for installing a ⅜" stud. There are different features for installing a lay-in type lug or ¼" stud, even a ½" stud. Two holes 915(1-2) lining up vertically are for mounting to a plastic block. Two rivets 920(1-2) diagonally located fasten the flat connector 910 and the "J" shaped jaw housing. A half shear on the flat connector 910 below the left rivet is optional to more precisely align the "J" shaped jaw housing with the flat bus. The top view shows the normal position when the "J" shaped jaw housing is aligned at the top edge. In the left and right view, the side profiles of all jaw assembly components are shown. The jaw spring combo 710 is riveted together. The inner side is a copper jaw with offset top portion to receive a meter blade. The middle portion of the copper jaw is flat contacting the "J" shaped jaw housing to assist electrical conduction so that the jaws can be more tolerable to the dimensional variances of meter blades. The tail portion of the jaw spring combo 710 extends from the tall wall to a short bypass tab, and leaves about ⅛" wide gap between the jaw spring combo 710 and the short bypass tab. The gap is for a ⅛" thick bypass blade to easily slide in and will be biased open more when the bypass ramp fully engages. Then the reaction force from the jaw spring combo 710 applies to the rotary bypass blades 415 and forces it to contact the short bypass tab to make an electrical connection. The jaw spring combo 710 is firmly pressed on the "J" shaped jaw housing by the compression spring 715. The compression spring 715 is mounted on the assembly with the shoulder screw 720 or a screw through a small tube. The shoulder of the screw 720 or the small tube is directly against the "J" shaped jaw housing through an oversized hole in the middle of the jaw spring combo 710. The length of the shoulder of the screw 720 or the small tube is designed to provide specific pressure on the jaw spring combo 710, and allow the compression spring 715 to compress more when the bypass is engaged. An oversized washer under the screw head keeps the compression spring 715 loaded.

Figure 14:
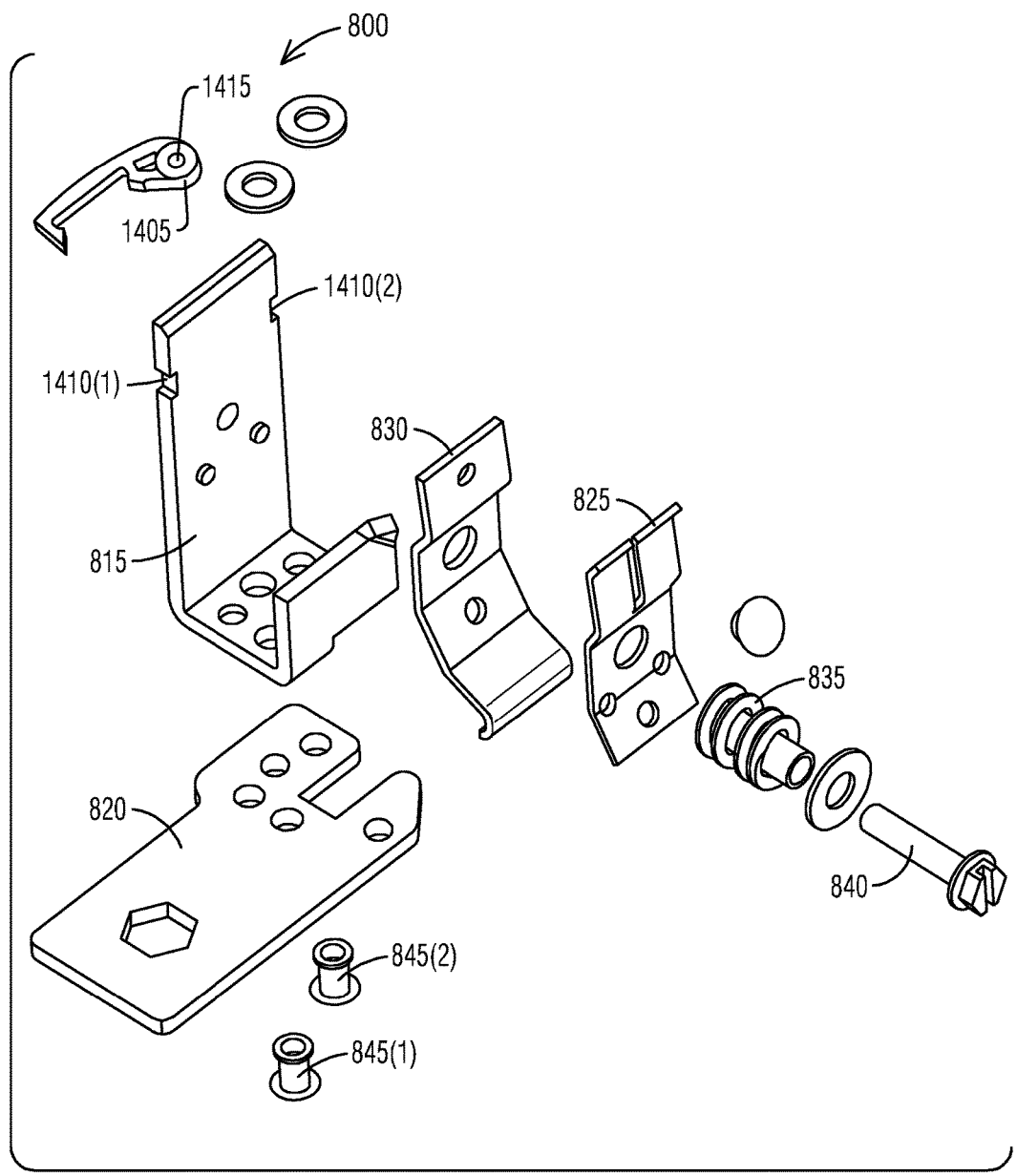
FIG. 14 shows an exploded view of the meter jaw of FIG. 8 in accordance with an exemplary embodiment of the present invention.

FIG. 14 shows an exploded view of the second meter jaw 800 of FIG. 8 in accordance with an exemplary embodiment of the present invention. The second meter jaw 800 comprises a tadpole shaped clip 1405 to hook on the top portion of the "J" shaped jaw housing where two rectangular slots 1410(1-2) are notched. The extended feature of the tadpole shaped clip 1405 hugs on back of the "J" shaped jaw housing, the top and bottom surfaces of the clip 1405 stuck in between the sides of the rectangular notches, while the hook feature at the end of the clip 1405 embraces the inside of the rectangular notches. A hole 1415 at the head of the clip 1405 is to mount the plastic shield 305 (See FIG. 3).

The second meter jaw 800 is a clamp jaw that includes the clamp jaw assembly 810 that includes the jigsaw mechanism 812 situated in the top portion 500(1) of the 3 phase lever bypass meter socket block assembly 200. The jigsaw mechanism 812 includes a copper jaw bus 815, a contact plate 820, a jaw spring 825, a bypass spring 830, a compression spring 835, a shoulder screw 840, a rivet or two fasteners 845(1-2).

The copper jaw bus 815 and the contact plate 820 are assembled to the clamp jaw assembly 810 with one or more fasteners. The jaw spring 825 and the bypass spring 830 are attached together with a rivet to form a spring combo. The clamp jaw assembly 810 and the spring combo are assembled with the compression spring 835 and the shoulder screw 840 or a screw and a cylinder spacer. The second meter jaw 800 further includes the clamp jaw bypass mechanism 850 that includes a jaw opening formed between the copper jaw bus 815 and the jaw spring 825 to receive a rotary bypass blade of the plurality of rotary bypass blades 415(1-3) of the bypass mechanism 505.

FIG. 15 shows a perspective view of a meter jaw 1500 of prior art. A flat connector 1505 is welded to a jaw housing 1510 that is formed in a complicated wrap around shape. The opening on the side is for bypass. The clamp inside the jaw housing 1510, which can pivot to a pin, is a sophisticated combination of forming an assembly, including the spring bias for the bypass, a tab to engage with a clamp spring on the back of the jaw housing 1510, and a clamp to hold a meter blade. A yoke wrapping 1515 around the jaw housing 1510 is holding the clamp spring and applying preload on the spring. The tab on the yoke is for mounting a plastic shield, serving the same function as the tadpole shaped clip 1405 shown in FIG. 14. The meter jaw 1500 needs 3 special high maintenance dies and four assembly fixtures. The jaw housing 1510 requires very special and expensive copper alloy to accommodate its formation and welding.

FIG. 16 illustrates a flowchart of a method 1600 for providing the second meter socket 800 for watt-hour meters according to an exemplary embodiment of the present invention. Reference is made to the elements and features described in FIGS. 1-15. It should be appreciated that some steps are not required to be performed in any particular order, and that some steps are optional.

The method 1600 comprises a step 1605 of providing the block assembly 200 mounted at a center of the meter socket 5. The block assembly 200 includes a top portion and a bottom portion. The method 1600 further comprises a step 1610 of providing a bypass mechanism situated in the bottom portion of the block assembly 200. The bypass mechanism includes a plurality of rotary bypass blades coupled to a lever arm.

The method 1600 further comprises a step 1615 of providing the plurality of clamp jaws 310(1-6). Each clamp jaw 310 includes a clamp jaw assembly that includes a jigsaw mechanism situated in the top portion of the block assembly. The jigsaw mechanism includes a copper jaw bus, a contact plate, a jaw spring, a bypass spring, a compression spring, a shoulder screw, a rivet and two fasteners. Each clamp jaw 310 further includes a clamp jaw bypass mechanism that includes a jaw opening formed between the copper jaw bus and the jaw spring to receive a rotary bypass blade of the plurality of rotary bypass blades of the bypass mechanism.

The method 1600 further comprises assembling the copper jaw bus and the contact plate to the clamp jaw assembly with two fasteners, attaching together the jaw spring and the bypass spring with a rivet to form a spring combo and assembling the clamp jaw assembly and the spring combo with the compression spring and the shoulder screw. The meter socket is a single phase lever bypass meter socket having four clamp jaw assemblies or is a three phase lever bypass meter socket having six clamp jaw assemblies.

As used herein, "clamp jaw" refers to a specific type of a meter jaw that may provide a fastening device for use to hold or secure objects tightly together to prevent movement or separation through the application of inward pressure. A typical residential meter socket is of the "plug-in type" in which the bayonet stabs on the meter are retained and clamped to corresponding meter jaws using the inherent spring pressure of the meter jaws. For some residential applications, and for the majority of commercial and industrial applications, a "clamp-jaw" type of meter socket is employed. In the clamp jaw type meter socket, the clamping force of the jaws upon the meter bayonets is enhanced by the addition of a spring, such as a straight beam spring or a coil spring. The meter socket assembly is equipped with a meter bypass which permits changing or testing of the meter without interrupting service to the load end. Generally, in the bypass mode of operation, the jaws of the meter jaw assemblies are opened, releasing the meter bayonets, and the line and load contacts of the same phase are shorted by an associated bypass contact member.

The techniques described herein can be particularly useful for a meter socket that contains a plurality of "clamp jaws" to accept blades or contacts on a base of a watt-hour meter. While particular embodiments are described in terms of the "clamp jaws", the techniques described herein are not limited to the "clamp jaws" but can also use other forms of "meter jaws".

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A meter socket for watt-hour meters, the meter socket comprising:
   a block assembly mounted at a center of the meter socket, wherein the block assembly including a top portion and a bottom portion;
   a bypass mechanism situated in the bottom portion of the block assembly, wherein the bypass mechanism includes a plurality of rotary bypass blades coupled to a lever arm; and
   a plurality of clamp jaws, each clamp jaw including:
      a clamp jaw assembly that includes a jigsaw mechanism situated in the top portion of the block assembly, wherein the jigsaw mechanism includes a copper jaw bus, a contact plate, a jaw spring, a bypass spring, a compression spring, a shoulder screw, a rivet or one or more fasteners,
      wherein the compression spring is disposed external to a gap between the copper jaw bus and a jaw spring combo of the jaw spring and the bypass spring using the shoulder screw for externally preloading the pressure,
      wherein the copper jaw bus including a "J" shaped jaw housing having only a face wall with no wrap around shape,
      wherein the compression spring is compressed outside of the jaw spring combo and against the copper jaw bus while the copper jaw bus, the jaw spring combo and the compression spring are disposed in a sequence, and
      a clamp jaw bypass mechanism that includes a jaw opening formed between the copper jaw bus and the jaw spring to receive a rotary bypass blade of the plurality of rotary bypass blades of the bypass mechanism.

2. The meter socket of claim 1, wherein the copper jaw bus and the contact plate are assembled to the clamp jaw assembly with one or more fasteners.

3. The meter socket of claim 2, wherein the jaw spring and the bypass spring are attached together with a rivet to form a spring combo.

4. The meter socket of claim 3, wherein the clamp jaw assembly and the spring combo are assembled with the compression spring and the shoulder screw or a screw and a cylinder spacer.

5. The meter socket of claim 1, wherein the meter socket is a single phase lever bypass meter socket having four clamp jaw assemblies.

6. The meter socket of claim 1, wherein the meter socket is a three phase lever bypass meter socket having six clamp jaw assemblies.

7. The meter socket of claim 1, wherein the meter socket includes a meter cover and an enclosure, wherein the meter cover with a round opening for a watt-hour meter is secured to the enclosure with a rotary latch.

8. The meter socket of claim 1, wherein the block assembly is a 3 phase lever bypass meter socket block assembly that has a plastic shield on top of the plurality of clamp jaws such that the plastic shield has 3 pairs of rectangular slots to let through watt-hour meter blades to plug into the plurality of clamp jaws under the plastic shield.

9. The meter socket of claim 1, wherein the plurality of clamp jaws are meter jaws that are vertically mounted on a plastic block.

10. The meter socket of claim 9, wherein the plurality of rotary bypass blades are installed on the lever arm to engage with the plurality of clamp jaws for activating the plurality of clamp jaws, bypassing the plurality of clamp jaws, disengaging the plurality of clamp jaws and releasing the plurality of clamp jaws.

11. The meter socket of claim 1, further comprising:
a meter socket supporting bracket extending on both sides of a plastic shield, wherein the lever arm is installed through the meter socket supporting bracket.

12. The meter socket of claim 1, wherein when the lever arm is at a resting position a lever arm handle rests at a lower position and the plurality of rotary bypass blades are in a normal angle to a surface of the plastic block.

13. The meter socket of claim 12, wherein when the lever arm is engaged in an upper position the plurality of rotary bypass blades insert into a gap between a lower tab of a clamp jaw of the plurality of clamp jaws such that one side of a rotary bypass blade of the plurality of rotary bypass blades makes contact to the lower tab of the clamp jaw of the plurality of clamp jaws, while another side of the rotary bypass blade of the plurality of rotary bypass blades pushes a lower portion of the jaw spring and drives the clamp jaw of the plurality of clamp jaws open at a top.

14. A meter jaw, comprising:
a connector assembly, wherein the connector assembly including:
a jaw spring combo;
a compression spring; and
a shoulder screw or a screw and a cylinder spacer,
wherein the compression spring is disposed external to a gap between a copper jaw bus and the jaw spring combo using the shoulder screw for externally preloading the pressure,
wherein the copper jaw bus including a "J" shaped jaw housing having only a face wall with no wrap around shape, and
wherein the compression spring is compressed outside of the jaw spring combo and against the copper jaw bus while the copper jaw bus, the jaw spring combo and the compression spring are disposed in a sequence.

15. The meter jaw of claim 14, wherein a plastic clip hooks on a back of the meter jaw, the plastic clip has a hole at an end for mounting a plastic shield.

16. The meter jaw of claim 14, wherein the connector assembly is assembled together by either two screws or two rivets.

17. The meter jaw of claim 14, wherein the connector assembly is a fastened together flat bus and a "J" shaped jaw housing.

18. A method for providing a meter socket for watt-hour meters, the method comprising:
providing a block assembly mounted at a center of the meter socket, wherein the block assembly including a top portion and a bottom portion;
providing a bypass mechanism situated in the bottom portion of the block assembly, wherein the bypass mechanism includes a plurality of rotary bypass blades coupled to a lever arm; and
providing a plurality of clamp jaws, each clamp jaw including:
a clamp jaw assembly that includes a jigsaw mechanism situated in the top portion of the block assembly, wherein the jigsaw mechanism includes a copper jaw bus, a contact plate, a jaw spring, a bypass spring, a compression spring, a shoulder screw, a rivet and two fasteners,
wherein the compression spring is disposed external to a gap between the copper jaw bus and a jaw spring combo of the jaw spring and the bypass spring using the shoulder screw for externally preloading the pressure,
wherein the copper jaw bus including a "J" shaped jaw housing having only a face wall with no wrap around shape,
wherein the compression spring is compressed outside of the jaw spring combo and against the copper jaw bus while the copper jaw bus, the jaw spring combo and the compression spring are disposed in a sequence, and
a clamp jaw bypass mechanism that includes a jaw opening formed between the copper jaw bus and the jaw spring to receive a rotary bypass blade of the plurality of rotary bypass blades of the bypass mechanism.

19. The method of claim 18, further comprising:
assembling the copper jaw bus and the contact plate to the clamp jaw assembly with two fasteners;
attaching together the jaw spring and the bypass spring with a rivet to form a spring combo; and
assembling the clamp jaw assembly and the spring combo with the compression spring and the shoulder screw.

20. The method of claim 18, wherein the meter socket is a single phase lever bypass meter socket having four clamp jaw assemblies or is a three phase lever bypass meter socket having six clamp jaw assemblies.

* * * * *